(12) United States Patent
Gruetzner et al.

(10) Patent No.: US 6,219,811 B1
(45) Date of Patent: Apr. 17, 2001

(54) TEST CIRCUIT AND METHOD FOR INTERCONNECT TESTING OF CHIPS

(75) Inventors: Mathias Gruetzner, Stuttgart; Wilfred Hartmann, Gechingen; Cordt-Wilhelm Starke, Weil der Stadt, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/301,743

(22) Filed: Sep. 6, 1994

(30) Foreign Application Priority Data

Apr. 9, 1993 (EP) .................................................. 93114212

(51) Int. Cl.[7] .................................................. G06F 11/26
(52) U.S. Cl. ............................................. 714/726; 714/30
(58) Field of Search ...................... 371/22.3; 395/183.06, 395/183.19

(56) References Cited

U.S. PATENT DOCUMENTS

| | | | |
|---|---|---|---|
| 4,771,428 | * 9/1988 | Acuff et al. ......................... | 371/25.1 |
| 4,791,358 | * 12/1988 | Sauerwald et al. ................. | 324/73.1 |
| 5,077,740 | * 12/1991 | Kanuma .............................. | 371/22.3 |
| 5,202,625 | * 4/1993 | Farwell .............................. | 371/22.3 |
| 5,278,841 | * 1/1994 | Myers ................................. | 371/20.6 |
| 5,373,514 | * 12/1994 | Ma .................................... | 371/57.1 |
| 5,416,409 | * 5/1995 | Hunter ............................. | 324/158.1 |
| 5,444,715 | * 8/1995 | Gruetzner et al. ................. | 371/22.3 |

\* cited by examiner

*Primary Examiner*—Robert W. Beausoliel, Jr.
*Assistant Examiner*—Scott T. Baderman
(74) *Attorney, Agent, or Firm*—Robert A. Walsh

(57) ABSTRACT

The invention relates to a test circuit, and a test method that provides testing for interconnect capability for chips (100, 110). Each of the chips (100, 110) comprises combinational logic (172, 173, 160, 161, 176, 177) as well as a plurality of scan chains (170, 171, 150, 151, 174, 175). Test data is shifted into the scan chains from pattern generators (180, 181) and is then transmitted from a selected sending chip (100) via its transceiver means (130) to the receiving chip (110). The chip (100) is selected by the selector (120) which is located on chip (100). During an interconnect test sequence, different chips in the test system are selected by the selector (120) for testing.

17 Claims, 5 Drawing Sheets

| Zi | a | b | c | d | |
|----|---|---|---|---|---|
| 0  | 0 | 0 | 0 | 0 | ⎫ |
| 1  | 0 | 0 | 0 | 1 | ⎬ fi = LOG 1, fj = LOG 0 |
| 2  | 0 | 0 | 1 | 0 | |
| 3  | 0 | 0 | 1 | 1 | ⎭ |
| 4  | 0 | 1 | 0 | 0 | ⎫ |
| 5  | 0 | 1 | 0 | 1 | ⎬ fi = LOG 0, fj = LOG 1 |
| 6  | 0 | 1 | 1 | 0 | |
| 7  | 0 | 1 | 1 | 1 | ⎭ |
| 8  | 1 | 0 | 0 | 0 | ⎫ |
| 9  | 1 | 0 | 0 | 1 | |
| 10 | 1 | 0 | 1 | 0 | |
| 11 | 1 | 0 | 1 | 1 | ⎬ fi = LOG 0, fj = LOG 0 |
| 12 | 1 | 1 | 0 | 0 | |
| 13 | 1 | 1 | 0 | 1 | |
| 14 | 1 | 1 | 1 | 0 | |
| 15 | 1 | 1 | 1 | 1 | ⎭ |

TEST CIRCUIT AND METHOD FOR INTERCONNECT TESTING OF CHIPS

FIELD OF THE INVENTION

The invention relates to a circuit, system, and method which provides interconnect test capability for chips that have a transceiver circuit and storage circuit.

BACKGROUND OF THE INVENTION

One of the best known test methods for testing large scale integrated circuits is level sensitive scan design (LSSD) which is described in the article "A Logic Design Structure for LSI Testability", Proceedings of the Design Automation Conference, No. 14, 20–22, June 1977, New Orleans, La., by E. B. Eichelberger. See also U.S. Pat. No. 4,590,078, U.S. Pat. No. 4,428,060 and E. J. McCluskey, "A Survey of Design for Test-ability Scan Techniques", VLSI Design, Dec. 1984, pp. 38–61, for a comprehensive list of patents and publications for the testing of electronic structures.

Cordt W. Starke, "Design for Testability and Diagnosis in a VLSI CMOS System/370 Processor", IBM Journal of Research and Development, Volume 34, No. 2/3, March/May 1990, pp. 355–362, describes a design of combinational logic circuits which incorporates on-chip test pattern generation and on-chip test response evaluation for logic fault detection. In this paper, the combinational logic circuits are coupled together in a typical level-sensitive scan design (LSSD) by shift register latches (SRL's) which are configured to form a test scan path. The test patterns are generated by a linear feed back shift register (LFSR) which is configured as a pseudo-random pattern generator which is implemented on the chip. To apply a test pattern, the shift register latches are loaded via the test scan path. Then the system clocks are pulsed once to execute one operational cycle of the system. After the system clocks are applied, the test response is shifted out of the shift register latches via the test scan path for further evaluation. However, the above cited prior art is silent as to interconnect testing of chips and only refers to the internal testing of a chip.

IEEE Standard 1149.11 and C. M. Maunder, R. E. Tulloss, "The Test Access Port and Boundary-Scan Architecture", IEEE Computer Society Press, 1990, describe a boundary-scan architecture that—in principle—allows the testing of chip interconnections. One disadvantage of that architecture is, that it does not allow the simulation of high speed data links between chips.

In IBM Technical Disclosure Bulletin, Volume 34, No. 6, November 1991, pp. 325–330, by P. K. Graham an AC interconnect test with series boundary scan is described. If an interconnection between two IC chips is to be tested according to this method, first an enable signal is applied to the corresponding driver. After the enabled driver is switched on, a receiver clock is pulsed to capture the initialization values into the receiver latches. Only at this point, the timed portion begins. The B-clock of the system is pulsed to the driver data latch. Then, in a minimal, worst case-time after the B-clock, the receiver clock (C-clock) is pulsed to capture the driver data transitions in the receiver boundary latches. This is the end of the time portion. Thus this prior art test method does not provide for an interconnect test that simulates system operation in the functional mode. Other approaches are known from P.P. Fasang, "Microbit Brings Self-Testing on Board Complex Micro Computers", Electronics, Mar. 10, 1982, pp. 116–119, and K. D. Wagner, T. W. Williams, "Enhanced Board Functional Self-Test by Concurrent Sampling", International Test Conference 1991, pp. 633–640. Again these test methodologies do not provide for the simulation of high speed data links between chips that occur in the functional mode.

Another known technique for interconnect testing of chips is the usage of a circuit tester, whereby a test head is applied to the circuit under test. The test head has a "bed of nails", i.e. a plurality of test needles serving to contact the circuit components under test. This technique is disadvantageous in that the testing frequency is restricted due to the usage of test needles and their associated capacitance and signal delay. A further problem of that technique is the mechanical tolerance of the test needles.

SUMMARY OF THE INVENTION

It is therefore a feature of the present invention to provide an improved test circuit, and method that allows interconnect testing of chips.

The invention is an electronic device having a test circuit to provide interconnect testing capability between first and second integrated circuits (ICs). The first IC has a first transceiver for providing an input and output operation, and a first storage device, electrically coupled to the first transceiver means, for storing test data. The second IC has a second transceiver means for providing an input and output operation. The test circuit specifically has a selector circuit, electrically coupled to the first and second transceivers, for 1) enabling the output operation of the first chip, and the input operation of the second chip, and 2) enabling a data link between the first and second transceiver means.

An additional feature of the invention is that the IC has a test data pattern generator, coupled to the first storage means, for generating a pattern of test data to be transferred and stored in the first storage means. In addition, the second IC has a second storage means, electrically coupled to the test data pattern generator via the first storage means, first transceiver means, second transceiver means. The second storage means is designed for storing test data received from test data pattern generator when the selector circuit 1) enables the output operation of the first chip, and the input operation of the second chip, and 2) enables the data link between the first and second transceiver means. Further, the second IC has a signature register means, coupled to the second storage means, for receiving and analyzing test data receiving from the second storage means.

An additional feature of the invention is that the selector circuit has a counter circuit that creates a counting signal. The counter circuit is coupled to a first decoder means, which is exclusively electrically coupled to the first transceiver means. The first decoder means receives counting signals and then forwards a first decoder signal to the first transceiver. In addition, the selector circuit has a second decoder means, exclusively electrically coupled to the second transceiver means, for receiving counting signals and then forwarding a second decoder signal to the second transceiver.

Other features and advantages of the present invention may become more clear from the following detailed description of the invention, taken in conjunction with the accompanying drawings and claims.

DETAILED DESCRIPTION OF THE INVENTION

Figure 1:
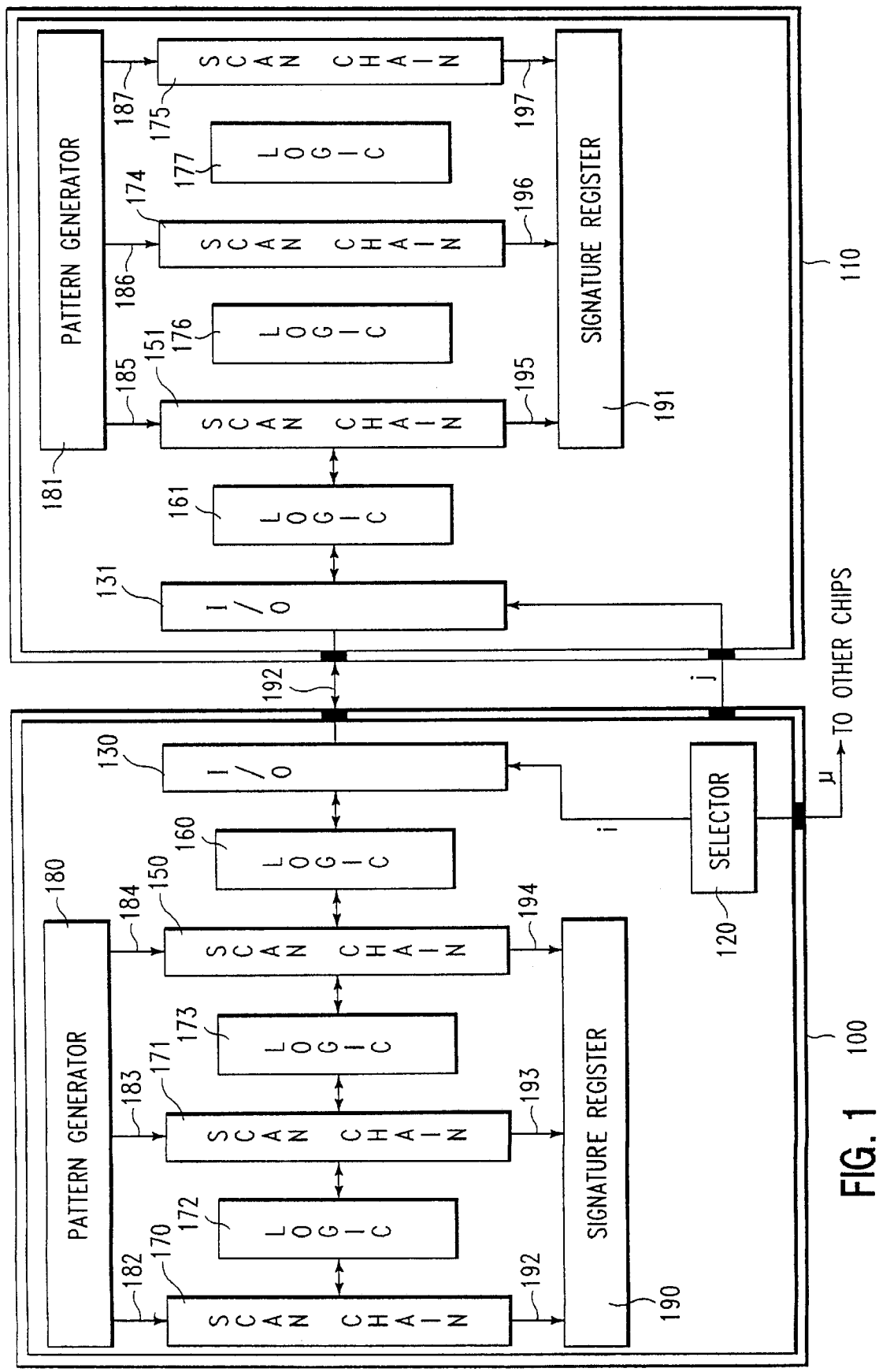
FIG. 1 is a schematic block diagram of a test system according to the invention.

FIG. 1 shows an embodiment of the invention having LSSD scan design. The LSSD scan technique is described e.g. in W. G. Spruth, "The Design of a Microprocessor", Springer-Verlag 1989, pp. 246–255.

The test system comprises chips 100 and 110 and a plurality of further chips that are not shown in the drawing. The chips 100, 110 each comprise a transceiver 130, 131. Transceivers are described e.g. in Paul Horovitz, "The Art of Electronics", second edition, Cambridge University Press 1989, page 603. The chips 100, and 110 each comprise scan chains 170, 171, 150 and 151, 174, 175, respectively, as well as combinational logic 172, 173, 160 and 161, 176, 177, respectively. The sequential logic 172, 173 and 176, 177 is interposed between scan chains 170, 171, 150 and 151, 174, 175, respectively, whereas the combinational logic 160 of chip 100 is located between the scan chain 150 and the transceiver means 130, and the logic 161 of chip 110 is located between scan chain 151 and transceiver means 131.

The chips 100, 110 further comprise a pattern generator 180, 181 and a signature register 190, 191, respectively. The pattern generator 180, 181 generates test data that is shifted into the scan chains 170, 171, 150, 151, 174, 175 via lines 182 to 187. After a test is carried out by applying the system clocks the resulting test data stored in the scan chains 170, 171, 150, 151, 174, 175 is shifted into the signature register 190, 191 via lines 192 to 197, respectively. The technique of analyzing the signature of the test response is described e.g. in R. A. Frohwerk, "Signature Analysis: A New Digital Field Service Method", Hewlett Packard Journal, May 1977, pp. 2–8, and B. Beckmann, J. Mucha, "Was ist Signaturanalyse?", Elektronische Rechenanlagen, 24. Jahrgang, 1982, Heft 1, pp. 16–18.

The test system shown in FIG. 1 further comprises a selector 120 that is connected to the transceiver means 130, 131 via lines i, j, respectively. The selector 120 is connected to the transceiver means of other chips that are not shown in the drawing via additional lines $\mu$. In the example shown in FIG. 1 the selector 120 is integrated in chip 100 but the selector 120 may be a separate circuit component. The chips 100, 110 and other chips of the test system not shown in the drawing are interconnected by a bus 192.

Before an interconnect test can start, the internal circuitry of each chip is tested, in particular the combinational logic 172, 173, 176, 177. This is done by disabling the transceiver means 130, 131 and thereby isolating the chips 100, 110. An internal self-test of the chips is preferably carried out according to the method described by C. W. Starke in the above cited article or according to P. H. Bardell, W. H. McAnney, "Self-Testing of Multi-Chip Modules", International Test Conference 1982, pp. 200–204.

By carrying out the internal self-test by means of a pattern generator 180, 181, also tested are the scan chains 170, 171, 150, 151, 174, 175, signature registers 190, 191, and the combinational logic 172, 173, 176, 177. However, the combinational logic 160, 161 is not tested because the path comprising logic 160, transceiver means 130, bus 192, transceiver means 131 and logic 161 is tested later in the interconnect test as explained below. However logic 160, for example, can be tested, if transceiver means 130 comprises a boundary scan chain. In this case, the path is not tested under timing constraints in the internal self-test. This is because the logic 160, 161 is not located between two scan chains within chips 100, 110 so that a self-test cannot be carried out according to known methods.

In the following interconnect test, chip 100 is the sending chip, whereas chip 110 and a plurality of other chips of the test system are receiving chips. Therefore, the selector 120 enables the driver of transceiver means 130 by issuing a signal on line i.

Test data is generated by pattern generator 180 and shifted into scan chain 150 via line 184. The scan chain 150 serves as storage means which is interconnected with the transceiver means 130 via the combinational logic 160. After the test data is stored in scan chain 150, a clocking signal is applied to the test system, so that the test data stored in the scan chain 150 is transmitted via logic 160, transceiver means 130 and the bus 192 to the chip 110 and the plurality of other chips of the test system. The data is received e.g. in chip 110 by the transceiver means 131 and transmitted via combinational logic 161 into the scan chain 151. The received data is stored in scan chain 151 that is equivalent to scan chain 150 in chip 100. Then the received test data is shifted out of scan chain 151 via line 195 into the signature register 191 for signature analysis. The same procedure is carried out analogously in the plurality of other chips that are not shown in the drawing. It is advantageous to shift in a new pattern of test data into scan chain 150 while the received data in scan chain 151 is shifted out into the signature register 191.

Further, it is advantageous to initialize the scan chain 151 prior to said interconnect test by the inverted test data whereby the test data are scanned into scan chain 150. The inverted test data is supplied by pattern generator 181. If random test data is used for carrying out the interconnect test, this procedure repeats several times to achieve an appropriate degree of test coverage.

In a second interconnect test, chip 110 is the sending chip and chip 100, and the plurality of other chips not shown in the drawing, is the receiving chip. In this case chip 110 takes the role of chip 100 in the first interconnect test—and vice versa—whereas the selector enables the driver of transceiver means 131 by issuing a signal via line j. Again the selector assures that only one chip 110 of the test system is a sending chip, whereas chip 100, and the other chips, are receiving chips. Thus, the signal issued via line i to the transceiver means 130 of chip 100 is no longer issued during the second interconnect test since chip 100 no longer acts as a sending chip but merely as a receiving chip. Each chip 100, 110, ... of the test system is connected to the selector 120 via a line i, j, $\mu$, ... respectively.

Figure 2:
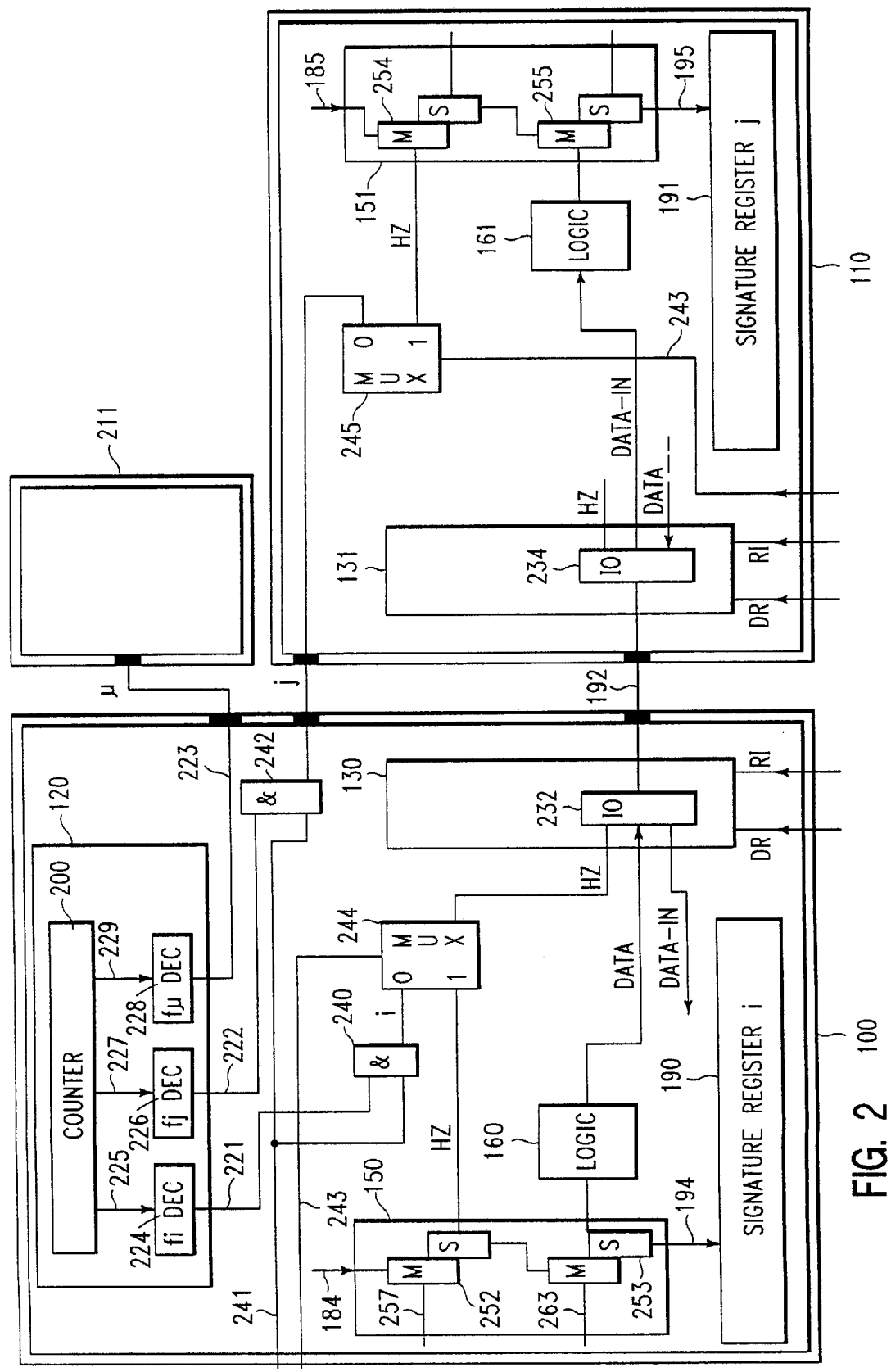
FIG. 2 shows the diagram of FIG. 1 in a more detailed view.

FIG. 2 gives a more detailed view of the test system shown in FIG. 1. The scan chain 150 comprises at least one shift register latch (SRL) 252, 253. The transceiver means 130 comprises at least one transceiver 232. SRL 253 serves as a storage means for test data, whereas the SRL 252 serves to store control data to control the enabling of the driver of transceiver 232 (HZ-control). This corresponds to an AC interconnect technique of European patent application 92

112 213.1. HZ-SRL 252 may be bypassed when test data is shifted into the scan path according to that European patent application.

Test data are shifted into scan chain 150 via line 184 from pattern generator 180 that is not shown in FIG. 2. The slave S of SRL 252 is connected via line "HZ" to the transceiver 232. A multiplexer 244 is interconnected between the HZ-SRL 252 and the transceiver 232. The multiplexer 244 is coupled via line i and gate 240 to an output 221 of the selector 120. The multiplexer 244 is only active if a signal "EX-ST" is applied via line 243 to the multiplexer 244. The signal "EX-ST" suggests that the test system is in the test mode and not in normal functional operation. If the signal "EX-ST" is not present, the line "HZ" is not interrupted by the multiplexer 244.

One input of AND gate 240 is the output 221 of decoder 120 and the other input is the signal "ST" which is applied via line 241 to the second input of and AND gate 240 so that the output of the selector 120 is only applied via line i and AND gate 240 to the multiplexer 244 if the signal "ST" is high. The signal "ST" is analogous to the signal "EX-ST" in that it indicates that the test system is in the test mode without specifying whether it is in the internal test mode or in the interconnect test mode.

The selector 120 comprises a dedicated output 221, 220, 223, for each of the chips, 100, 110, 211, of the test system. The selector 120 further comprises a dedicated decoder 224, 226, 228, for each of the outputs. The dedicated decoders 224, 226, 228, are coupled via lines 225, 227, 229, to a counter 200 of the selector means 120.

It is noted that the selector 120 can be controlled by a programmable control unit producing the dedicated outputs 221, 222, 223.

If in the first interconnect test the circuit 100 acts as a sending chip, data is shifted into the scan chain 150 via line 184 from pattern generator 180. Since, here, the signals "ST" and "EX-ST" are both high, the output 221 of the dedicated decoder 224 is input via AND gate 240, line i and the multiplexer 244 to the line "HZ", so that the driver of transceiver means 130 can be enabled thereby.

When the test data is present in SRL 253, and in the other SRL's that possibly store test data in the scan chain 150, a clocking signal is applied to the test system so that test data is transmitted from the slave S of the SRL 253, and the other SRL's storing test data, via logic 160 and line "DATA" to the transceiver means 232 that outputs the test data onto bus 192.

The chip 110 has a similar test structure to chip 100 that also applies for chip 211 and other chips not shown in FIG. 2. The SRL's 254, 255 of chip 110 correspond to the SRL's 252, 253 of chip 100 whereas the multiplexer 245 of chip 110 corresponds to the multiplexer 244 of chip 100. The transceiver means 131 comprises at least one transceiver 234 that corresponds to transceiver 232. Test data from transceiver 234 is entered via line "DATA IN" into the combinational logic 161. The output of logic 161 is inputed into the master latch M of SRL 255. After reception of the test data, the values in the scan chain 151 are shifted out into signature register 191 for signature analysis.

If the chip 110 is selected by selector 120 to be the sending chip in a second interconnect test, test data generated by pattern generator 181 that is not shown in FIG. 2 is shifted into scan chain 151 via line 185. After the data is shifted in, it is transmitted via logic 161 and line "DATA", via transceiver 234, bus 192, transceiver 232 and line "DATA IN" in chip 100 to one of the master latches M of an SRL in scan chain 150.

It is to be noted that for the second interconnect test, the driver of transceiver 234 is enabled by selector 120 via the output 222, AND gate 242 and multiplexer 245. The corresponding AND gates for the enabling of chip 211 and other chips of the system are not shown in FIG. 2 for simplicity.

Subsequently, further interconnect tests begin, whereby the selector 120 only selects one of the chips of the test system at a time as a sending chip whereas all the other chips of the test system that are not selected are receiving chips. Once a specific chip of the test system is selected to be a sending chip, an interconnect test can operate several times consecutively. This is particularly beneficial if a random pattern generator 180, 181 is used for generating pseudo random test data.

If, prior to said interconnect testing, the chips of the test system are tested internally, it is advantageous to isolate the chips of the test system from one another by applying a signal to the lines "DR" and "RI" to inhibit the driver and receiver of the transceivers 130, 131.

Figures 3, 8:
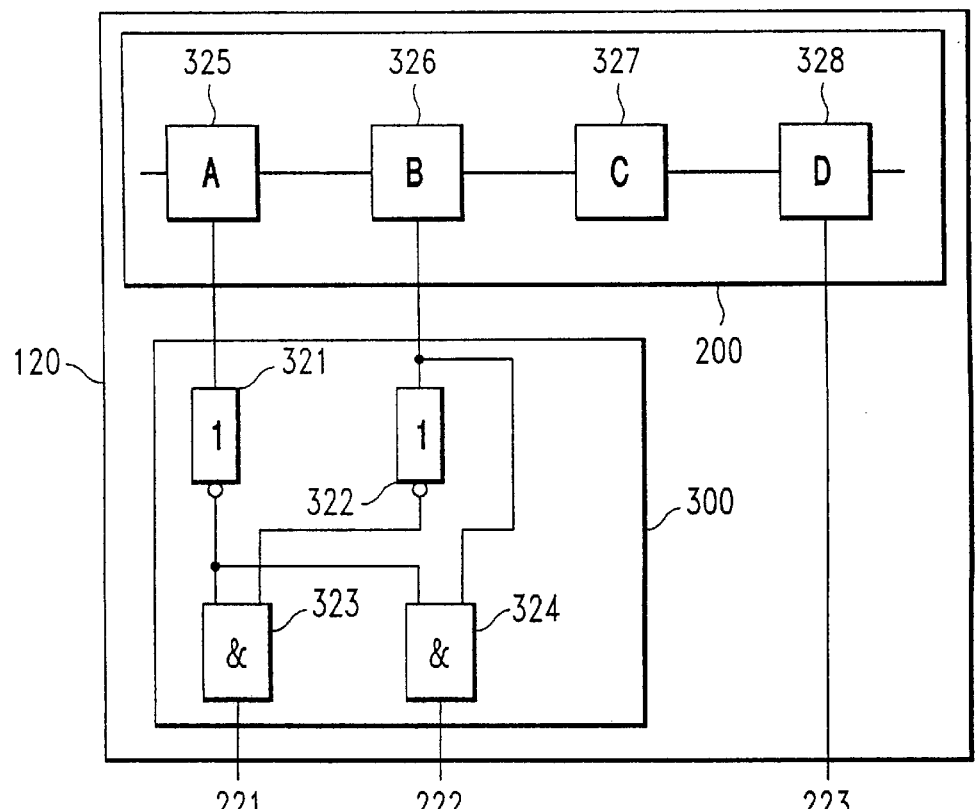
FIG. 3 illustrates the design and the operation of a selector according to the invention.
FIG. 8 is a table which illustrates the different states of the counter shown in FIG. 3.

FIG. 8 shows one example of a selector 120 according to the invention. The selector 120 comprises four registers 325, 326, 327, 328 that realize a 4-bit binary counter. The register 325 corresponds to the first bit position and the register 328 to the last bit position of the counter 200. The table in FIG. 8 shows the different states of the counter 200 and of the selector 120. Since in this example a 4-bit binary counter is employed there are 16 different states of the counter 200. In the first four states $Z_i (0 \leq i \leq 3)$ the output logic high is required at output 221 and the output logic low is required at output 222 if—in the simplest case—only the chips 100 and 110 are present in the test system.

In the second four states $(4 \leq i \leq 7)$ the output 221 is required to be logical low and the output 222 is required to be logical high. In the further consecutive states $(8 \leq i \leq 15)$ both of the outputs 221 and 222 are required to be logical low. However, if the selector 120 is realized by the programmable control unit, the number of states i for which a requirement of the outputs—logical low or high—is to be fulfilled is freely definable.

These requirements are fulfilled by the decoder means 300 which produce the outputs 221 and 222. Decoder means 300 comprises inverters 321, 322 and AND gates 323, 324. Register 325 is coupled to the input of inverter 321 and register 326 is coupled to the input of inverter 322 and to a first input of AND gate 324. The output of inverter 321 is connected to a first input Of AND gate 323 and to a second input of AND gate 324. The output of inverter 322 is connected to a second input of AND gate 323. The output of AND gate 323 produces the output 221 and the output of AND gate 324 produces the output 222.

The logic circuitry comprised in decoder 300 is found e.g. by using a Karnaugh diagram. If the output 221 is logic high, chip 100 is selected as a sending chip, whereas if the output 222 is logic high, the chip 110 is selected as a sending chip. During the states $Z_i (8 \leq i \leq 15)$ none of the chips 100 and 110 is selected because none of the outputs 221, 222 is logic high. If t here is a further chip 210 comprised in the test system those states can be used to select chip 210. In this case, decoder 300 is modified so that an output 223 is produced that serves to select chip 210 as a sending chip.

The invention is particularly beneficial in a multi-chip environment, where a multiplicity of chips are interconnected by one or several buses. A problem that might occur in a multichip environment is the problem of floating lines. If one of the chips of the test system is selected to be the sending chip, all of the other chips are—by definition of the selector 120—receiving chips. If e.g. chip 100 is selected by selector 120 all the lines of bus 192 that are connected to the transceiver means 130 of chip 100 are active due to the enabling of the drivers of the transceiver means 130. Data links are established via these active lines from the sending chip 100 to the other receiving chips of the test system— such as chip 110. Thus, in principle, all the lines of bus 192 linking a receiving chip and the sending chip 100 are active. However, there might be other lines of the bus 192 that interconnect receiving chips of the system but are not in contact with the transceiver means 130 of the sending chip 100. Here, the transceiver means 131 of chip 110 is connected via one or more active lines to the sending chip 100 and via one or more inactive lines to one or more other receiving chips of the system. The inactive lines that interconnect receiving chips have a floating undefined potential since the drivers of all of the receiving chips are in a high impedance (HZ) condition.

If an interconnect test is carried out between the sending chip 100 and the receiving chips of the system, the receiving chips receive test data issued by transceiver means 130 of chips 100 via the active lines of bus 192. On the other hand, the receiving chips receive a random signal via the lines that are not active since these lines are in a floating condition, because no data link is established via these lines. Nonetheless the random signal captured by the floating lines is received by the transceiver means 131 of the receiving chip 110 and is stored in the scan chain 151—if chip 110 is considered here by way of example. This may lead to an erroneous signature stored in signature register 191 and thus to an erroneous test result because of the random signal captured by the chip 110. The problem is that it is unpredictable which data is received by receiving chip via a floating line. Consequently, the corresponding position or positions in the scan chain 151 contain random data. Since this random data result from the floating lines interconnecting one or more receiving chips these random data do not contain any information as to the interconnect test of a sending chip 100 to the other receiving chips of the test system. However these floating lines influence the signature stored in signature register 191 of a receiving chip, since the random signal on the floating lines causes random data to be received by the receiving chips and thus random data that is stored in scan chain 151 on the corresponding bit positions that is used to calculate the signature.

In order to solve this problem the invention provides for a sensing means for sensing whether a data link is established between a sending and a receiving chip via a specific line. Before carrying out an interconnect test, the scan chain 151 of a receiving chip 110 is initialized. If the sensing means senses that a data link is not established this implies that the corresponding line is floating. Consequently the random signal of that floating line is rejected, i.e. the random data received by the transceiver means 131 of receiving chip 110 is not stored in the corresponding SRL of that line. Therefore the data stored in that SRL remains unchanged and is the initial data that is shifted into the scan chain 151 before carrying out the interconnect test. Since the data stored in an SRL that belongs to a floating line is no longer random, no erroneous signature is produced and the test results of the inventive interconnect test methodology are correct under all circumstances.

Figure 4:
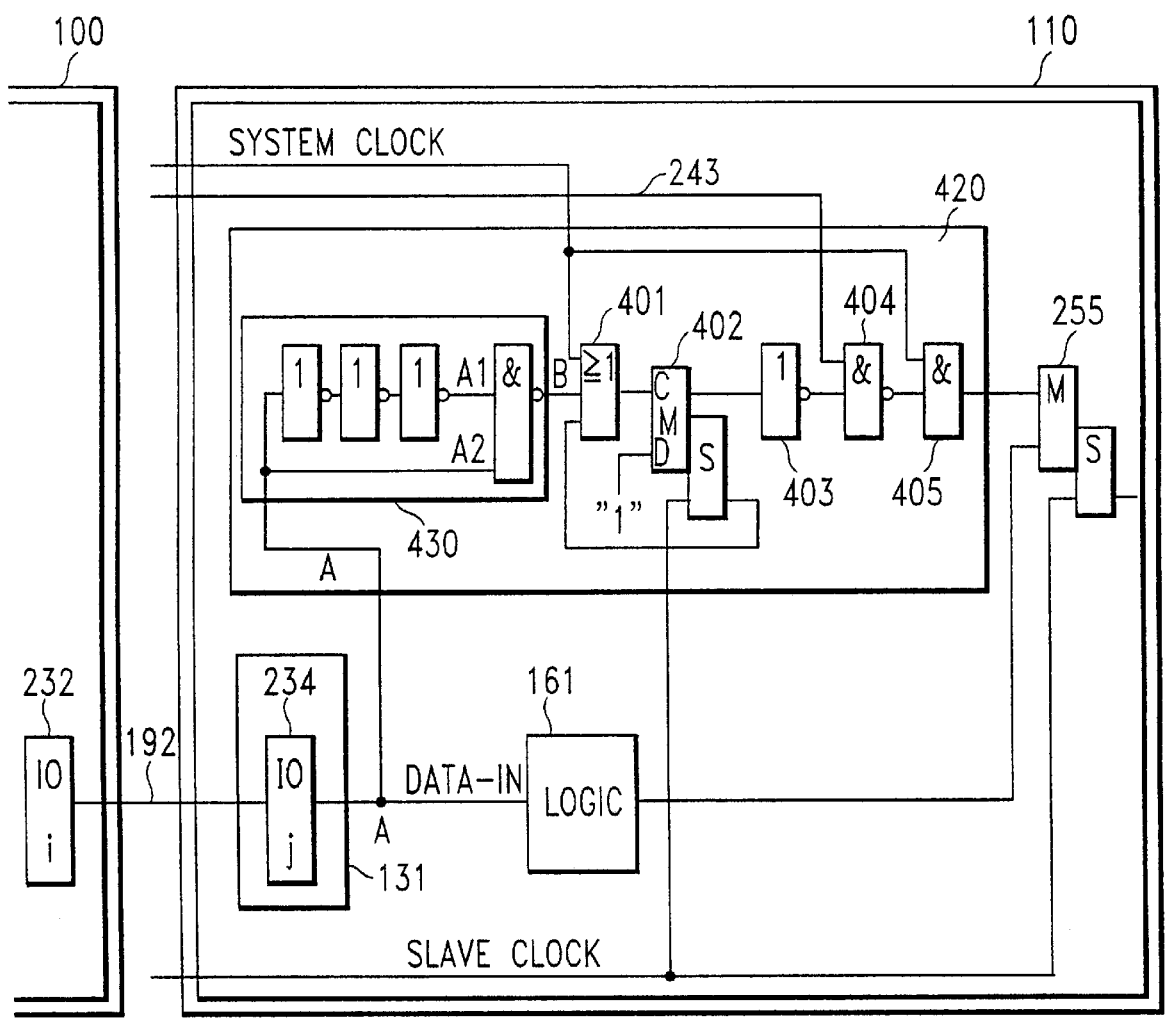
FIG. 4 shows a schematic diagram of a filter according to the invention.

FIG. 4 shows two chips 100, 110 whereby chip 110 comprises a sensing means 420 according to the invention. Beside the sensing means 420 all elements of FIG. 4 are also shown in FIG. 2. In this case it is assumed that both of the chips 100 and 110 are receiving chips so that the line 192 which links the transceivers 232 and 234 is floating and no data link is established. The signal A received by transceiver 234 is thus random. The signal A is inputted into the sensing means 420 as well as the system clock and the slave clock of the test system.

Sensing means 420 comprises a filter 430, an OR gate 401, a test latch 402, an inverter 403, a NAND gate 404 and an AND gate 405. The system clock is not connected directly to the master clock input of SRL 255 but is passed through the sensing means 420. Only if the sensing means 420 senses that a data link is established via line 192 is the system clock transmitted via sensing means 420 to the master clock input of the SRL 255. Only then is data received by transceiver means 234 stored in SRL 255.

In the opposite case considered here where no data link is established via line 192 the system clock is blocked by sensing means 420 so that no storage operation is carried out by SRL 255. Thus the initial data stored in SRL 255 remains unchanged and therefore is not random.

The signal A is inputted into the filter 430. Filter 430 only issues a pulse B, if the signal A changes from logic low to logic high. If such a pulse B occurs, this indicates that a data link is established.

One can assume a floating line to have a fixed but random potential. A characteristic of an active line however is that its potential is frequently changing from logically low to logically high and vice versa. Thus, such a transition is an indication for the presence of an active line.

The pulse B is input into OR gate 401. Only if a data link is established via line 192, this results in a pulse B, i.e., a transition from logic high to logic low. This pulse B is passed through the OR gate 401. Therefore, the pulse B clocks the clocking input C of the test latch 402. Before carrying out the interconnect test, the test latch 402 is initialized to contain a logical zero both in its master M and its slave S. At the data input D of the test latch a logical "1" is tied up and thus constantly present. If the clocking input C of the SRL 402 is clocked by the pulse B a logical "1" is inputted into SRL 402 and thus fed back to the OR gate 401, since the slave S of SRL 402 is connected to an input of the OR gate 401. Moreover the system clock is inputted into OR gate 401, so that the pulse B only propagates through the OR gate 401, if at the same time the system clock is logical low. In this example the system clock is logical low, if data is to be stored in the SRL 255 and logical high if no data is to be stored.

If a pulse B is caused by a data link that is established via line 192, this pulse B propagates through the OR gate 401 if the system clock is logical low at the same time. Thus, the test latch 402 is clocked. Consequently the logical "1" present at the data input D of test latch 402 is inputted into both the master and—with the following slave clock pulse— also into the slave of SRL 402. Since the slave S of the test latch 402 is also connected to an input of the OR gate 401 the output of the master M of test latch 402 remains unchanged at logical high for the rest of the first interconnect test sequence. It is to be noted that test latch 402 does not form part of any of the scan chains shown in FIG. 1. The output of the master M of test latch 402 is inverted by inverter 403 and inputted into NAND gate 404. The other input of NAND gate 404 is the signal "EX-ST" which is inputted via line 243. Since the signal "EX-ST" is logical high in the interconnect test mode the output of NAND gate 404 is also logical high since its other input coming from inverter 403 is logical low.

Due to the logical high signal that is input into AND gate 405, the other input of AND gate 405 which is the system clock propagates through the AND gate 405 and not changed thereby. The output of AND gate 405 is also the output of the sensing means 420. The output of sensing means 420 is inputted into the master clock input of SRL 255. The output of the sensing means 420 equals the system clock only under the condition that a pulse B is generated at the same time as the system clock is logical low, since only then a logical one is constantly present at one of the inputs of the AND gate 405.

It is also possible to not connect the system clock into the OR gate 401. However, the input of the system clock into the OR gate 401 protects the test system from the generation of an erroneous output of the sensing means 420. In the case that noise disturbances or the like on the floating line 192 should accidentally cause a pulse B to be generated this pulse B is ignored in the case that the system clock is logical high. If the system clock is inputted into OR gate 401, the pulse B may only propagate through the OR gate 401, if a reception of data is expected which is the case if the system clock is logical low and is thus supposed to clock the clocking input C of the master of SRL 255.

Figure 5:
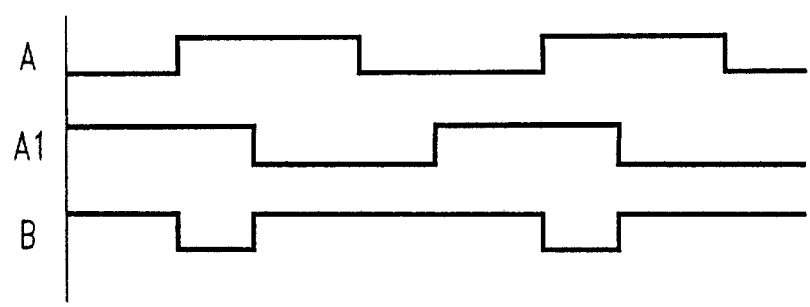
FIG. 5 illustrates signal transitions in the filter shown in FIG. 4.

The filter 430 into which the signal A is inputted comprises three inverters that are interconnected in series and a NAND gate. Signal A is inputted into the interconnected inverters which yields the output A1. The signal A1 is inputted into a first input of the NAND gate of the filter 430 whereas the second input signal A2 of the NAND gate is the signal A. The NAND gate outputs the pulses B. Each of the inverters has a certain delay. The sum of all delays of the inverters equals the length of a pulse B. This is also shown in FIG. 5. The number of inverters can be varied in order to vary the length of the pulse B. In this example the number of the inverters has to be uneven.

Figure 6:
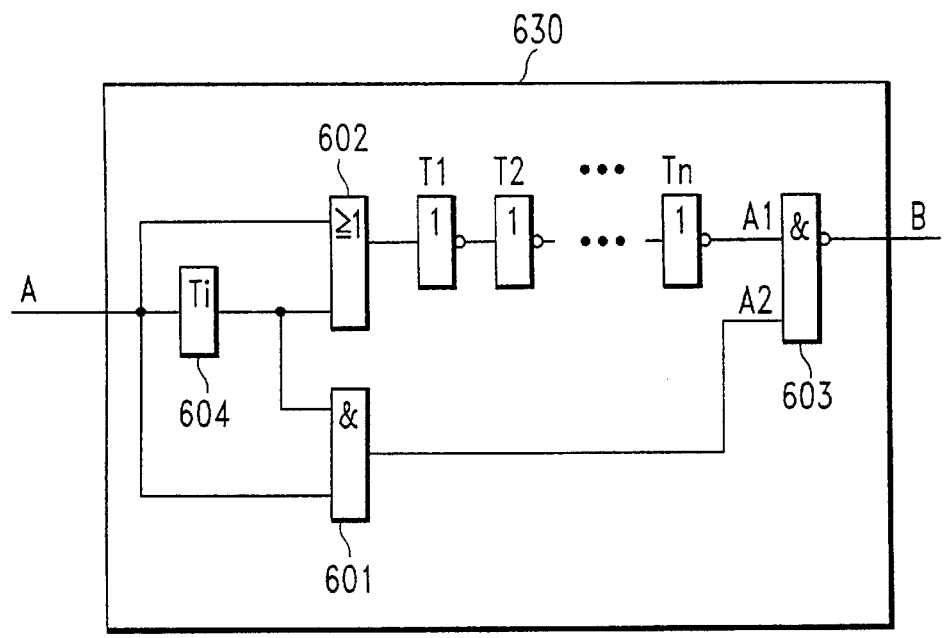
FIG. 6 schematically shows a diagram of a further embodiment of the filter.

In FIG. 6 another example of a filter 630 is shown. The filter 630 of FIG. 6 can replace filter 430 shown in FIG. 4. As compared to filter 430 the filter 630 additionally filters noise on the floating line in order to prevent an unintentional generation of a pulse B. The filter 630 comprises a delay component 604 which delays its input signal by a time interval Ti as well as an even number n of inverters I having time delays T1, T2, ..., Tn. The inverters are interconnected in series. The signal A is inputted into the filter 630. In the filter 630 the signal A is inputted into a first input of AND gate 601, into a first input of NOR gate 602 and into the delay component 604. The output of delay component 604 is inputted into a second input of AND gate 601 and into a second input of NOR gate 602. The output A2 of AND gate 601 is inputted into a first input of NAND gate 603. The output of NOR gate 602 is inputted into the series interconnection of the inverters I. The resulting signal A1 is inputted into the second input of NAND gate 603. The output of NAND gate 603 is the output pulse B of filter 630.

A pulse B is only generated by the filter 630 if a transition of the signal A forms logical low to logical one occurs whereby the state "logical high" must be maintained for at least the time Ti. Any spike or noise pulse captured by the floating line 192 will thus not result in a pulse B since generally noise spikes are shorter than the time Ti, if an appropriate choice of the delay time Ti of delay component 601 has been taken.

If an interconnect test is to be carried out according to the above described inventive test methodology, firstly one of the chips of the test system is selected to be a sending chip by the selector 120. In particular if a random test data pattern generator 180, 181 is used it is advantageous that this selection of a specific chip is valid for a plurality of data patterns to be sent by that chip. In the example shown in FIG. 3 the selection of selector 120 of chip 100 remains constant for the first four states $Z_i$ of the counter 200. In each state $Z_i$ of the counter 200, the following procedure is carried out:

Test data are shifted into the scan chain 150 of the selected sending chip 100 and are then received and stored by a consecutive system clock in the SRL's of its scan chain 151. The system clock pulse that caused the storage operation in the scan chain 151 of the receiving chip 110 increments the state $Z_i$ of counter 200 so that the next test sequence is carried out. In the example of FIG. 3, this is repeated four times for each selection of the chip 100 and 110 respectively. If a counter is used which has more bit positions, a much higher number of repetitions is feasible. The test latch 402 shown in FIG. 4 is initialized to contain logical "0" every time a new selection of a sending chip happens. This is sufficient since once a specific chip is selected and a data link is established it is clear which lines are floating lines that are not for this selection. However if a new chip is selected, this might change since lines that established a data link before may now be floating lines and vice versa.

Under certain conditions it is not necessary to provide every line 192 with sensing means 420. If, for example, a line forms part of a bus that exclusively interconnects chip 100 and chip 110, it is sufficient to provide one sensing means 420 for all of the lines belonging to that bus. If one of the lines of that bus is active, this implies that all the other lines of that bus are also active so that one sensing means 420 is sufficient for all of the lines belonging to that bus.

The invention also provides for an improved AC interconnect test capability. It allows the inclusion of the enabling of the driver that is to transmit test data to another IC chip into the timed portion of the interconnect test sequence. The driver may be, e.g., a three-state or open drain driver. This is used to test the interconnection between chips for a maximum data transmission rate. For a maximum data transmission rate it is desirable that, within one system cycle, a driver in the sending chip is selected and enabled and the data which is sent by the sending chip is received and stored in a receiving chip which is interconnected to the sending chip. According to the present invention it is not sufficient to test for maximum data transmission rate as required in the normal functional system mode without including the enabling of a driver of the sending chip within the timed portion of the test sequence. If the driver is enabled before the time critical portion of the test of the data transmission from the driver of the sending chip to the receiving chip begins, the functional system mode is not sufficiently tested. This is because the enabling of driver takes a relatively long period of time. Thus the enabling of a driver is a time critical step, if data are to be transmitted from one chip to another chip with a maximum transmission rate, e.g. in just one system cycle. The possibility to include the enabling of a driver in the timed portion of an AC interconnect test is thus an important advantage of the invention. The technique of including the driver enabling in the timed portion is described as such in above referenced unpublished European patent application 92 112 213.1.

Figure 7:
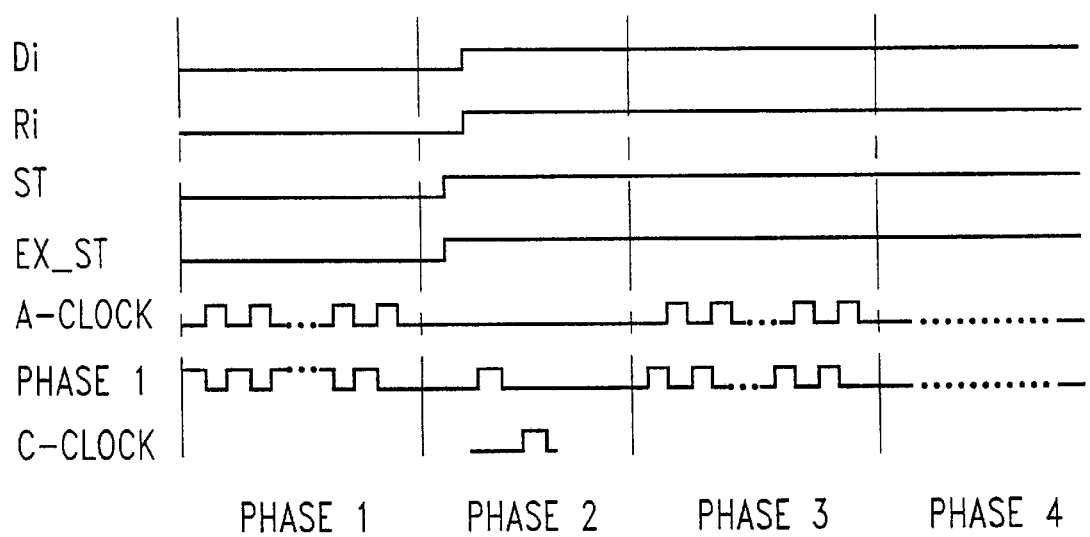
FIG. 7 illustrates signal transitions in the test system.

In FIG. 7 one example of the timing diagram of an interconnect test sequence is illustrated. In phase 1 of the interconnect test sequence the chips of the test system are initialized, i.e. test data is generated by the pattern generators 180, 181 and shifted into the scan chains 150, 151 by applying the A- and the B-clocks. The A-clock clocks the masters M of the SRL's for shift in whereas the B-clock clocks the slaves S of the SRL's. This technique of shifting in test data is known as such in level sensitive scan design.

During the shifting in of the test data the chips are isolated from one another since the signals DR and RI are both logic low. The same applies for the signals "ST" and "EX-ST".

After the initialization of the chips, the signals "ST" and "EX-ST" transition from logic low to logic high to show that the interconnect test may begin. By the consecutive B-clock pulse the test data stored in the masters M of the SRL's of scan chain 150 are output via logic 160 and transceiver means 130 and line 192 to chip 110. With the following system clock (C-clock) the received data is stored in the masters M of the scan chain 151. The C-clock pulse increments the counter 200 so that the counter 200 changes its state $Z_i$.

In the phase 3 of the interconnect test sequence the A and B-clocks are operated to shift out the received test data into the signature register 191 for analysis. As the received data is shifted out, new initialization data shifts into the scan chains 150 and 151. If a new selection of a sending chip is made, test latch 402 must be reset.

In phase 4, the phases 2 and 3 are repeated until the selector 120 reaches its last state $Z_i$ before another one of the chips of the test system is selected as a sending chip. In the example shown in FIG. 3 the phases 2 and 3 are repeated in phase 4 three times for both of the selections of the selector 120 in that example.

After the interconnect test sequence completes all test data patterns of a selected sending chip, the result of the signature analysis serves to decide the result of the interconnect test. After the selection of another of the chips the above described interconnect test sequence is repeated.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. It will also be understood that the invention is not limited to the particular embodiment described herein, but is capable of many rearrangements, modifications and substitutions without departing from the scope of the invention. The scope of the invention is, therefore, indicated by the appended claims rather than by the foregoing description. All changes that come within the meaning and range of equivalency of the claims are to be embraced within their scope.

What is claimed is:

1. A multi-chip semiconductor structure capable of providing interconnect testing capability, comprising:
   a plurality of integrated circuit chips including a first chip and a second chip;
   said first chip having a first transceiver and a first storage coupled to said first transceiver;
   said second chip having a second transceiver and a second storage coupled to said second transceiver wherein said second chip further comprises a sensing circuit coupled to said second storage and said second transceiver, said sensing circuit for sensing when data is transferred between said first and said second chip;
   a selector circuit on one of said plurality of chips and coupled to all of said plurality of chips, said selector circuit having a circuit portion capable of controlling selection of said first and said second chip for the interconnect testing, said selector circuit further capable of selectively enabling said first and said second transceiver to enable transfer of test data from said first storage to said second storage.

2. The structure as recited in claim 1, said selector circuit being located on said first chip, said selector circuit comprising:
   a first output coupled to said first transceiver; and
   a second output coupled to said second transceiver.

3. The structure as recited in claim 2, said selector circuit further comprising:
   a counter for generating counter signals;
   plurality of decoders coupled to said counter and to said first and second outputs, said decoders for generating first and second decode signals to be routed over said first and said second outputs to activate said first and second transceivers, respectively.

4. The structure as recited in claim 1, wherein data stored in said second storage is not changed if said sensing circuit senses that data is not being transferred from said first chip.

5. The structure as recited in claim 1, wherein said sensing circuit comprises a digital filter interconnected between said second transceiver and said second storage.

6. The structure as recited in claim 5, wherein said digital filter allows a write operation to said second storage only if said second transceiver receives from said first transceiver a signal comprising a transition from a first logic state to a second logic state.

7. The structure as recited in claim 6, said digital filter further comprising logic for filtering noise received by said second transceiver.

8. The structure as recited in claim 1, said first chip further comprising:
   a third storage for storing control data to control said first transceiver;
   a first multiplexer interconnected between said first storage and said first transceiver, and coupled to said selector circuit; and
   a first control circuit for inhibiting an interconnection between said third storage and said first transceiver by said first multiplexer when said selector circuit enables said output operation of said first transceiver.

9. The structure as recited in claim 1, said first chip further comprising:
   a chip clock electrically coupled to said first storage;
   a system clock that is coupled to said chip clock, said first storage, and a third storage when said selector circuit has enabled transfer of test data for an interconnect test.

10. A test method for interconnect testing, comprising the steps of:
    a) providing a plurality of chips including a first chip and a second chip;
       said first chip comprising a first transceiver for providing an input and an output operation, said first chip further comprising a first storage electrically coupled to said first transceiver, said first storage for storing test data;
       said second chip comprising a second transceiver for providing an input and an output operation, said second chip further comprising a second storage electrically coupled to said second transceiver, said second storage for storing test data;
       wherein one of said plurality of chips has a selector circuit having a circuit portion capable of controlling selection of said first and said second chip for the interconnect testing;
    b) using said selector circuit to enable said output operation of said first transceiver and to enable said input operation of said second transceiver to establish a data link between said first transceiver and said second transceiver; and
    c) sensing whether said data link is established between said first and said second chip, whereby if data stored in said first storage remains unchanged during said sensing step said data link is incomplete.

11. The test method as recited in claim 9, further comprising the step of allowing a write operation of said second storage, when said second transceiver receives a signal having a transition from a first logic state to a second logic state.

12. An electronic device, comprising:

a plurality of integrated circuit chips including a first chip and a second chip, said first chip comprising a first transceiver for providing an input and output operation, said first chip further comprising a first storage electrically coupled to said first transceiver for storing test data;

a second chip comprising a second transceiver for providing an input and output operation; and a selector circuit on one of said plurality of chips, said selector circuit electrically coupled to said first and said second transceiver for 1) enabling said output operation of said first chip, and said input operation of said second chip, and 2) enabling a data link between said first and said second transceiver, said selector circuit having a circuit portion capable of controlling selection of said first and said second chip for the interconnect testing wherein said second chip comprises a sensing circuit for sensing when data is transferred between said first and said second chip said sensing circuit comprising means to detect a transition in a data signal.

13. The electronic device of claim 12, said first chip further comprising:

a test data pattern generator coupled to said first storage for generating a pattern of test data to be transferred to and stored in said first storage;

said second chip further comprising a second storage electrically coupled to said test data pattern generator via said first storage, said first transceiver, and said second transceiver, said second storage for storing test data received from said test data pattern generator when said selector circuit 1) enables output operation of said first chip and input operation of said second chip, and 2) enables said data link between said first transceiver and said second transceiver; and a signature register coupled to said second storage for receiving and analysing test data received from said second storage.

14. The electronic device of claim 12, wherein said selector circuit further comprises:

a counter circuit that creates a counting signal;

a first decoder electrically coupled to said first transceiver for receiving counting signals and then forwarding a first decoder signal to said first transceiver; and a second decoder electrically coupled to said second transceiver for receiving counting signals and then forwarding a second decoder signal to said second transceiver.

15. A multi-chip semiconductor structure capable of providing interconnect testing capability, comprising:

a plurality of integrated circuit chips including a first chip and a second chip, there being interconnect wiring therebetween;

a selector circuit on one of said plurality of chips and coupled to said plurality of chips, said selector circuit for selectively enabling transfer of test data between said first chip and said second chip to test said interconnect wiring, said selector circuit having a circuit portion capable of controlling selection of said first and said second chip for the interconnect testing wherein said second chip comprises a sensing circuit for sensing when data is transferred between said first and said second chip, said sensing circuit comprising means to detect a transition in a data signal.

16. The structure as recited in claim 15, said selector circuit comprising a counter for generating counter signals, said selector circuit further comprising a plurality of decoders coupled to said counter, said selector circuit for selecting different interconnect wirings for testing.

17. The structure as recited in claim 15, comprising a test data pattern generator on one of said plurality of chips for generating a pattern of test data to be transferred between said first chip and said second chip to test said interconnect wiring.

* * * * *